United States Patent
Gunawan

(10) Patent No.: US 9,651,354 B2
(45) Date of Patent: *May 16, 2017

(54) CALIBRATION FREE DISTANCE SENSOR

(75) Inventor: Oki Gunawan, Fair Lawn, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1088 days.

This patent is subject to a terminal disclaimer.

(21) Appl. No.: 13/568,619

(22) Filed: Aug. 7, 2012

(65) Prior Publication Data

US 2014/0032166 A1 Jan. 30, 2014

Related U.S. Application Data

(63) Continuation of application No. 13/556,780, filed on Jul. 24, 2012.

(51) Int. Cl.
G01B 7/14 (2006.01)
G01R 33/00 (2006.01)
G01B 7/02 (2006.01)

(52) U.S. Cl.
CPC ............... *G01B 7/14* (2013.01); *G01B 7/023* (2013.01); *G01R 33/0035* (2013.01)

(58) Field of Classification Search
CPC ................................ G01R 33/07; G01D 5/145
See application file for complete search history.

(56) References Cited

U.S. PATENT DOCUMENTS

| | | | |
|---|---|---|---|
| 4,580,251 A | 4/1986 | Koukovinis | |
| 5,086,273 A * | 2/1992 | Leon | G01B 7/14 116/277 |
| 5,140,263 A * | 8/1992 | Leon | G01B 7/14 116/277 |
| 5,291,782 A * | 3/1994 | Taylor | G01B 7/02 324/207.16 |
| 5,504,426 A | 4/1996 | Ricci et al. | |
| 6,762,922 B2 | 7/2004 | Mednikov et al. | |
| 7,196,515 B2 * | 3/2007 | Roessler | G01D 5/142 324/207.2 |
| 2012/0084051 A1* | 4/2012 | Hackner | G01V 3/081 702/153 |
| 2013/0043863 A1* | 2/2013 | Ausserlechner | G01D 5/145 324/207.2 |
| 2013/0154621 A1* | 6/2013 | Moenkemoeller | G01B 7/14 324/207.11 |

OTHER PUBLICATIONS

Baxter, Larry K., "Capacitive Sensors Design and Applications", IEE Press Series on Electronics Technology, 1996, p. 139.
Griffiths, David J., "Introduction to Electrodynamics", International Edition, Third Edition, 1999, p. 246.

* cited by examiner

*Primary Examiner* — Mischita Henson
*Assistant Examiner* — Terence Stifter, Jr.
(74) *Attorney, Agent, or Firm* — Cantor Colburn LLP; Vazken Alexanian

(57) ABSTRACT

One or more embodiments are directed to a magnet configured to be coupled to an object under test, an array of sensors configured to measure a magnetic field associated with the magnet, and a circuit configured to obtain voltage readings based on the measured magnetic field from the array of sensors and compute a distance between the array of sensors and the magnet based on the obtained voltage readings.

10 Claims, 4 Drawing Sheets

US 9,651,354 B2

CALIBRATION FREE DISTANCE SENSOR

CROSS-REFERENCE TO RELATED APPLICATIONS AND PRIORITY CLAIM

This application is a continuation of U.S. Non-Provisional application Ser. No. 13/556,780, entitled "CALIBRATION FREE DISTANCE SENSOR", filed Jul. 24, 2012, which is incorporated herein by reference in its entirety.

FIELD OF INVENTION

The present disclosure relates generally to sensors, and more specifically, to calibration free magnetic distance sensors.

DESCRIPTION OF RELATED ART

Short range distance measurements (e.g., about 0.1 millimeters (mm) to about 1 meter (m)) are often needed in many applications, such as in connection with electronics and mechanical manufacturing, metrology, microscopy, lithography, and assembly line testing. Conventional sensors may require calibration to convert a signal to a distance. For example, an ultrasonic sensor may require calibration to account for the speed of sound, which may vary as a function of temperature. A capacitive sensor may require calibration to account for a variation in its dielectric spacer and/or a fringing effect associated with the capacitor plate area.

BRIEF SUMMARY

According to one or more embodiments of the present disclosure, a system for providing a calibration free sensor comprises a magnet configured to be coupled to an object under test, an array of sensors configured to measure a magnetic field associated with the magnet, and a circuit configured to obtain voltage readings based on the measured magnetic field from the array of sensors and compute a distance between the array of sensors and the magnet based on the obtained voltage readings.

According to one or more embodiments of the present disclosure, an apparatus comprises at least one processor, and memory having instructions stored thereon that, when executed by the at least one processor, cause the apparatus to obtain at least one Hall voltage reading from each of a plurality of sensors associated with an array of sensors, and compute a distance between a magnet coupled to an object under test and the array of sensors based at least in part on the obtained Hall voltage readings.

According to one or more embodiments of the present disclosure, a non-transitory computer program product comprises a computer readable storage medium having computer readable program code stored thereon that, when executed by a computer, performs a method comprising reading a voltage from each of a plurality of Hall sensors associated with an array, fitting the read voltages as a function of position along a line between a magnet and the array, calculating a slope and an intercept associated with the fit voltages, and calculating a distance between the magnet and the array based on the slope and intercept.

According to one or more embodiments of the present disclosure, a method comprises reading a voltage from each of a plurality of Hall sensors associated with an array, fitting the read voltages as a function of position along a line between a magnet and the array, calculating a slope and an intercept associated with the fit voltages, and calculating a distance between the magnet and the array based on the slope and intercept.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the disclosure are apparent from the following detailed description taken in conjunction with the accompanying drawings in which:

DETAILED DESCRIPTION

Figure 1:
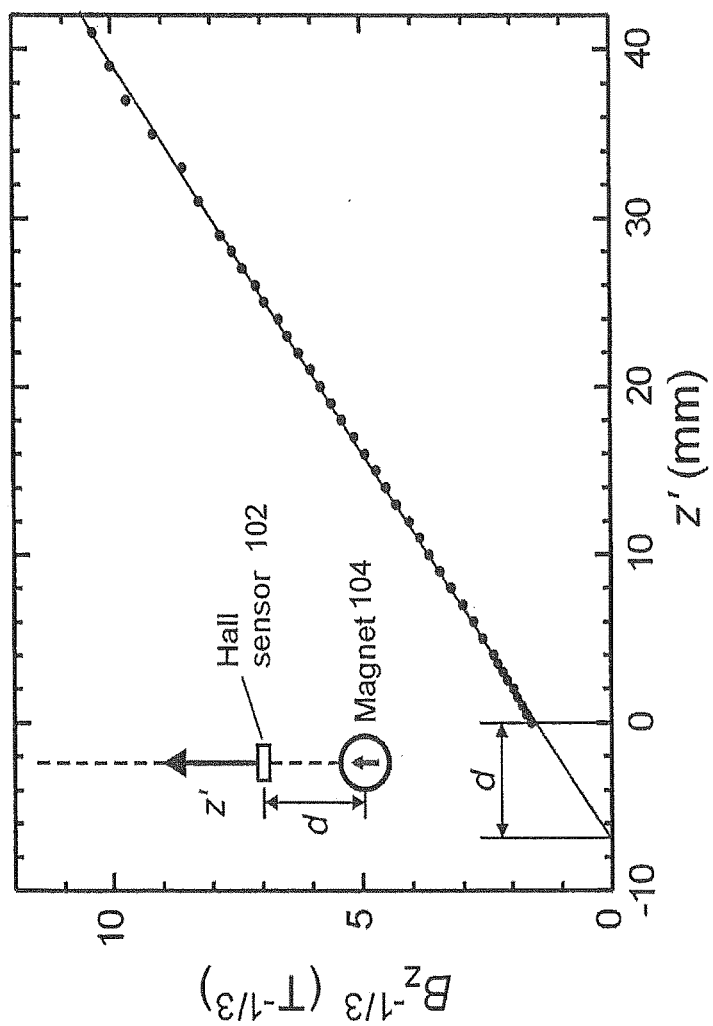
FIG. 1 is a graph illustrating an exemplary plot of a magnetic field as a function of position in accordance with one or more aspects of this disclosure.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this regard, a coupling of entities may refer to either a direct or an indirect connection.

In some embodiments, a calibration free magnetic distance sensor may include an array of sensors, such as Hall sensors. In some embodiments, a spherical magnet may be mounted on an object under test, and the spherical magnet may produce or generate a magnetic field in accordance with a $1/d^3$ distance dependence or relationship. Analyzing the magnetic field measured by the array of sensors may yield a distance to the magnet, and hence, to the object under test. The measurement may be independent of the magnet's magnetic moment or a conversion factor associated with the sensor(s). Thus, a low-cost, calibration free, non-contact, and robust solution may be provided for measuring distance.

A magnet (e.g., a cylindrical magnet, a spherical magnet, or a magnet of any other configuration or geometry) may be used as a source of a magnetic field. In some embodiments, the distribution of the magnetic field may adhere to that of an ideal point dipole magnet, following a $1/d^3$ dependence along the dipole axis. The magnetic field of a point dipole at any position vector r may be given by the following equation #1:

$$B(r) = \frac{\mu_0}{4\pi} \frac{3\hat{r}(\hat{r} \cdot m) - m}{r^3} \qquad \text{Eq. \#1}$$

In equation #1, B is the magnetic field vector, m is the magnetic moment vector, r̂ is the unit vector of r and $\mu_0$ is the magnetic permeability in a vacuum.

Along a magnetic dipole axis z (see the inset of FIG. 1), equation #1 may simplify to equation #2 as follows:

$$B_z = \frac{\mu_0}{2\pi}\frac{m}{z^3} \quad \text{Eq. \#2}$$

In equation #2, m may be the magnetic moment of the magnet that represents the strength of the magnet. This magnetic field can be measured by a Hall sensor to yield a voltage $V_H$ proportional to the magnetic field, as described in equation #3:

$$V_H = kB_z \quad \text{Eq. \#3}$$

In equation #3, k may correspond to a conversion factor.

In principle, by measuring the magnetic field $B_z$ using a Hall sensor, the distance to the magnet could be determined. However, such a determination might require measurement or "calibration" of the magnetic moment m (equation #2) and the conversion factor k (equation #3). Furthermore, for measurements performed over a long operation time, the magnetic moment m may vary. Such variation may be large, especially in an environment full of vibrations or characterized by high ambient temperature.

Embodiments of the disclosure may eliminate a need to perform calibration. For example, assuming that a magnet is placed at an unknown distance d from an initial position z'=0, equation #2 may be rewritten as equation #4 as follows:

$$B_z^{-1/3} = \left(\frac{\mu_0 m}{2\pi}\right)^{-1/3}(z' + d). \quad \text{Eq. \#4}$$

Using equation #3, equation #4 may be expressed in terms of Hall voltage ($V_H$) in equation #5 as follows:

$$V_H^{-1/3} = \left(\frac{k\mu_0 m}{2\pi}\right)^{-1/3}(z' + d) \quad \text{Eq. \#5}$$

As expressed, equations #4 and #5 yield a linear relationship of the form y=a+bx between $B_z^{-1/3}$ (or $V_H^{-1/3}$) and z'. Such a linear relationship is reflected in an example of experimental data plotted in FIG. 1, where a Hall sensor 102 may be moved (e.g., moved continuously) from z'=0.

A linear fit may be performed with respect to the data associated with FIG. 1 to obtain the slope b and intercept a. Afterwards, the distance d may be calculated in accordance with equation #6 as follows:

$$d = -a/b \quad \text{Eq. \#6}$$

Using such a technique, it might not be necessary to know the magnetic moment or strength m or the conversion factor k to computer the distance d from the sensor 102 to a magnet 104. Thus, a calibration free technique may be provided.

In some embodiments, an array of sensors may be used to implement a calibration free distance sensor. The array of sensors may include two or more sensors, such as two or more Hall sensors. The array of sensors may be arranged in accordance with one or more geometrical shapes or parameters. For example, in some embodiments a linear array may be used.

Figure 2:
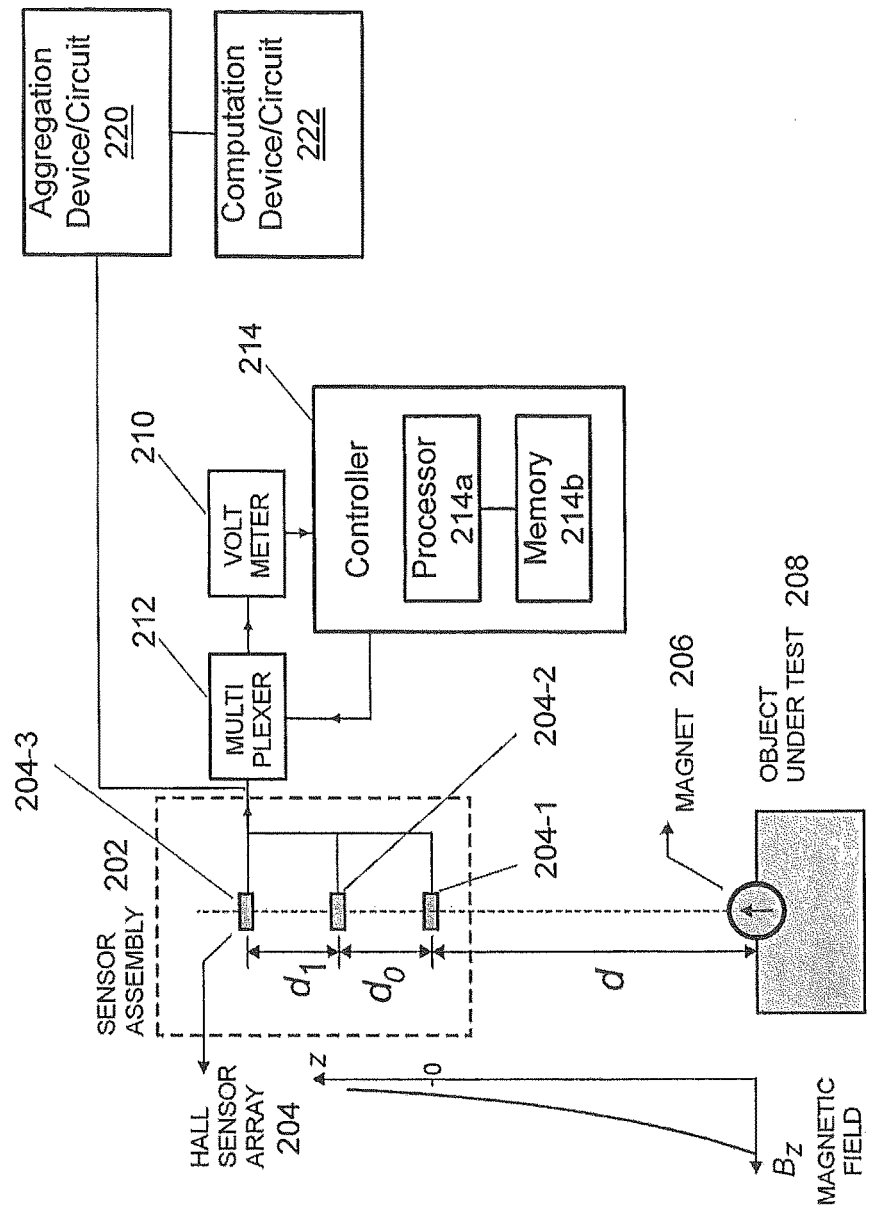
FIG. 2 is a schematic block diagram illustrating an exemplary calibration free sensor system in accordance with one or more aspects of this disclosure.

FIG. 2 is a schematic block diagram illustrating an exemplary calibration free sensor system. A sensor assembly 202 may include an array 204. The array 204 may include a number of sensors. For example, as shown in FIG. 2, the array 204 may include sensors 204-1, 204-2, and 204-3. The sensors 204-1 and 204-2 may be separated by a distance $d_0$, and the sensors 204-2 and 204-3 may be separated by a distance $d_1$. In some embodiments, the separations $d_0$ and $d_1$ may be the same (e.g., $d_0=d_1$) and may be predetermined. In some embodiments, one or more of the sensors 204-1 through 204-3 may correspond to the sensor 102 of FIG. 1.

A magnet 206 (e.g., a spherical magnet), which may correspond to the magnet 104 of FIG. 1, may be mounted on an object under test 208, in order to determine a distance d from the object 208 to the array 204. The magnet 206 and/or the object 208 may be placed in a line under the array 204.

The array 204 may be configured to measure a magnetic field ($B_z$) associated with the magnet 206. For example, a voltage from each of the sensors 204-1 through 204-3 may be provided to a voltmeter 210 via one or more selection mechanisms, such as a multiplexer 212. The address or select lines of the multiplexer may be provided by a controller 214.

In some embodiments, the controller 214 may include a processor 214a, and a memory 214b storing instructions that, when executed by the processor 214a, cause the controller 214 to perform one or more of the methodological acts as described herein. In some embodiments, the memory 214b may store data, such as measurements provided by the voltmeter 210, address and/or select line values for the multiplexer 212, computations of the magnetic field $B_z$ and/or distance d, etc.

In some embodiments, an aggregation device or circuit 220 may be configured to obtain and/or store the readings (e.g., voltage readings) from the sensors 204-1 through 204-3. That same device or circuit, or another device or circuit (e.g., a computation device or circuit 222) may be configured to calculate the distance d based on the readings. In some embodiments, the voltmeter 210, the multiplexer 212, and/or the controller 214 may be included in the aggregation device/circuit 220 and/or the computation device/circuit 222. In some embodiments, one or more of the entities of FIG. 2 may be included in one or more circuits.

Figure 3:
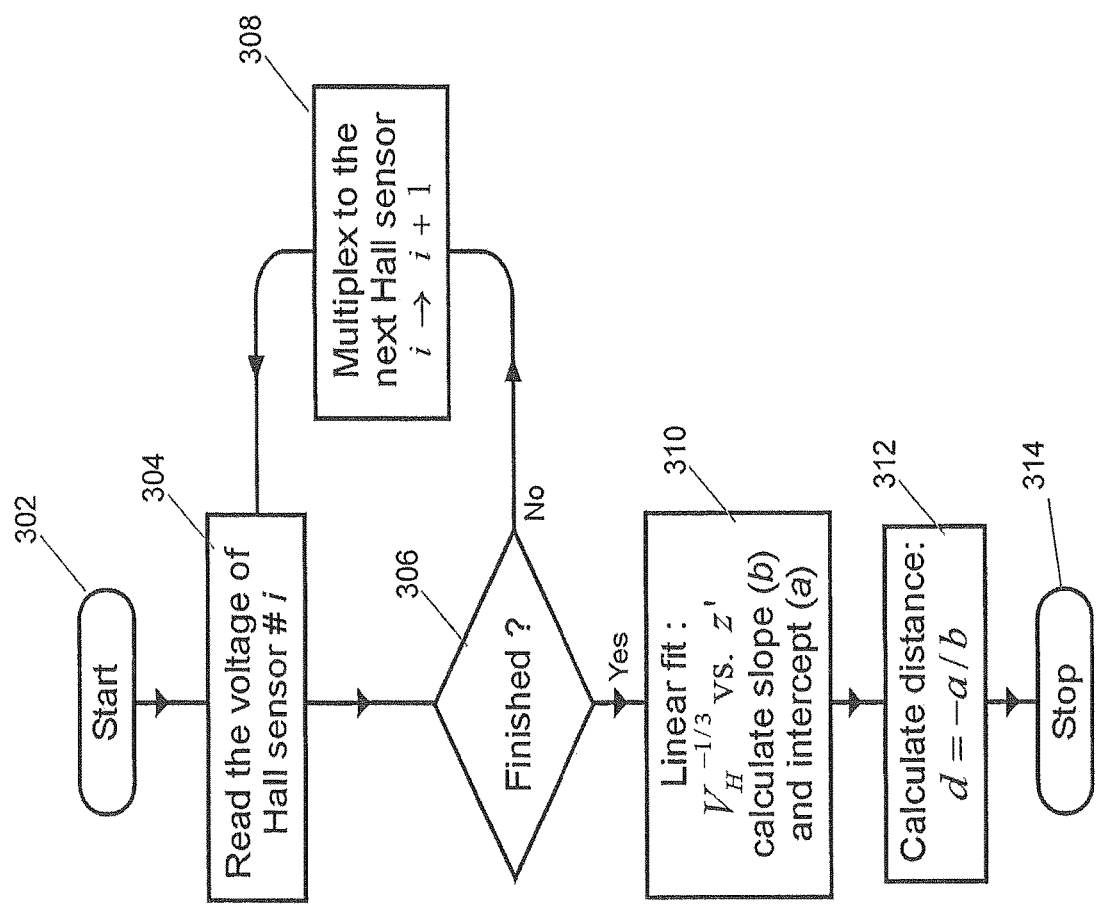
FIG. 3 is a flow diagram illustrating an exemplary method in accordance with one or more aspects of this disclosure.

FIG. 3 is a flow diagram illustrating an exemplary method. The method may be operative in connection with one or more architectures or systems, such as those described herein. For ease of explanation and illustration, the method of FIG. 3 is described below in connection with the system of FIG. 2. The method may be used to determine the distance d of the magnet 206 (and hence the object 208) from the array 204.

In block 302, the method may start or begin. As part of block 302, one or more initialization processes or routines may be invoked. For example, a first sensor (e.g., the sensor 204-1) may initially be selected, and the controller 214 may provide corresponding address or select line values to the multiplexer 212.

In block 304, the voltage from the selected sensor (generally denoted as sensor '#i' in FIG. 3) may be read by the voltmeter 210. The read voltage, potentially in combination with the values for the address or select lines of the multiplexer 212, may be saved at or stored by the controller 214, or another entity not necessarily shown in FIG. 2. More generally, the read voltage may be saved in associated with indicia indicative of the selection of a given sensor.

In block 306, a determination may be made whether voltages have been read from all the sensors (e.g., all of the sensors 204-1 through 204-3). If not (e.g., the "No" path is taken out of step 306), then the address or select lines of the multiplexer may be changed (e.g., incremented) in block 308 to prepare to read the voltage from another or the next sensor. If all the sensors have been read (e.g., the "Yes" path is taken out of block 306), then flow may proceed to block 310.

In block 310, the controller 214 (or another entity) may linearly fit the voltages read in connection with blocks as a function of position along z'. The fitting may be based at least in part on the predetermined or known separation or spacing between the sensors 204-1 through 204-3 included in the array 204. From the fit, characteristics such as slope (b) and intercept (a) may be calculated.

In block 312, the distance d may be calculated in accordance with equation #6 described above. The calculated distance d may be output to, e.g., an analog signal like voltage proportional to the distance, a digital signal containing an information of the distance, a display screen (e.g., a computer monitor), an email, a text message, a document, a fax/facsimile machine, a voice message, etc.

In block 314, the method may stop or end.

The blocks or events described above in connection with FIG. 3 are illustrative. In some embodiments, one or more events (or a portion thereof) may be optional. In some embodiments, one or more additional events not shown may be included. For example, in some embodiments a voltage may be read from a given sensor multiple times as part of a filtering or averaging algorithm to reduce the impact of non-idealities (e.g., noise) and/or to improve the accuracy or resolution. In some embodiments, the events may execute in an order or sequence different from what is shown in FIG. 3.

Figure 4:
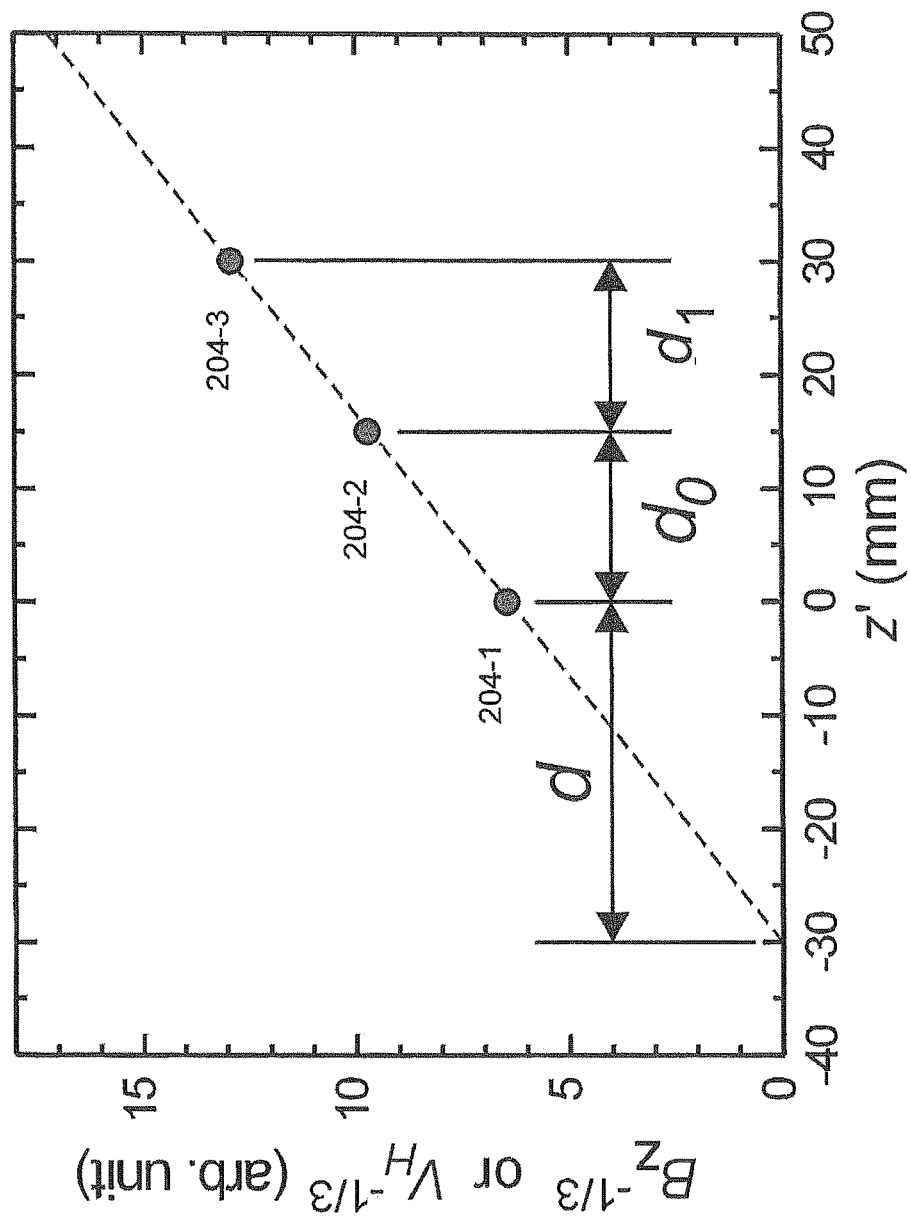
FIG. 4 is a graph illustrating an exemplary plot of a magnetic field or Hall voltage as a function of distance in accordance with one or more aspects of this disclosure.

FIG. 4 is a graph illustrating an exemplary plot of a magnetic field or hall voltage as a function of location or position. In some embodiments, the graph of FIG. 4 may be obtained having executed the method of FIG. 3 in connection with the system of FIG. 2. The graph of FIG. 4 shows the magnetic field $B_Z$ or the Hall voltage $V_H$ as a function of position or location along the z-axis of FIG. 2, where the initial or starting point (z'=0) corresponds to the location of the sensor 204-1, and wherein the $B_Z$ or $V_H$ values are shown corresponding to the locations of the sensors 204-1, 204-2, and 204-3. In the example of FIG. 4, the magnet 206 is located a distance d=30 mm from the sensor 204-1, the sensors 204-1 and 204-2 are separated by $d_0$=15 mm, and the sensors 204-2 and 2043 are separated by $d_1$=15 mm. The values shown in FIG. 4 are arbitrary/illustrative, as is the units shown on each of the respective axes.

In some embodiments various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

As will be appreciated by one skilled in the art, aspects of this disclosure may be embodied as a system, method or computer program product. Accordingly, aspects of the present disclosure make take the form of an entirely hardware embodiment, an entirely software embodiment (including firmware, resident software, micro-code, etc.) or an embodiments combining software and hardware aspects that may all generally be referred to herein as a "circuit," "module" or "system." Furthermore, aspects of the disclosure may take the form of a computer program product embodied in one or more computer readable medium(s) having computer readable program code embodied thereon.

Any combination of one or more computer readable medium(s) may be utilized. The computer readable medium may be a a computer readable storage medium. A computer readable storage medium may be, for example, but not limited to, an electronic, magnetic, optical, electromagnetic, infrared, or semiconductor system, apparatus, or device, or any suitable combination of the foregoing. More specific example (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming language, including an object oriented programming language such as Java, Smalltalk, C++ or the like and conventional procedural programming language, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the disclosure may be tied to particular machines. For example, in some embodiments one or more devices may manage or sequence the reading of data (e.g., voltages) from one or more sensors. Such management may include providing a value for address/select lines of a multiplexer and saving/storing one or more pieces of data (e.g., one or more voltage readings). In some embodiments, one or more devices may perform a computation of a distance based on the readings.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method comprising:
   coupling a spherical magnet that produces pure dipole magnetic field to an object under test;
   providing a linear array of at least three Hall sensors, each configured to measure the magnetic field associated with the spherical magnet and to produce at least one Hall voltage reading that corresponds to the measured magnetic field associated with the spherical magnet;
   obtaining, via a multiplexer, the at least one Hall voltage reading from each of the linear array of at least three Hall sensors in a time-division manner;
   measuring, via a voltmeter, the at least one Hall voltage reading from each of the linear array of at least three Hall sensors in a time-division manner;
   fitting, via a controller, each of the at least one Hall voltage reading received from the multiplexer as a function of position along a line between the spherical magnet and the linear array of at least three Hall sensors;
   calculating, via the controller, a slope and an intercept associated with each of the fit Hall voltage readings; and
   computing, via the controller, a distance between the spherical magnet and the linear array of at least three Hall sensors based on the slope and the intercept.

2. The method of claim 1, further comprising:
   storing the at least one Hall voltage reading from each of the linear array of at least three Hall sensors in association with indicia indicative of each of the linear array of at least three Hall sensors having been selected.

3. The method of claim 1, further comprising:
   providing at least one of an address and a select line value to the multiplexer to selectively sequence reading the at least one Hall voltage reading from each of the linear array of at least three Hall sensors.

4. The method of claim 1, further comprising:
   outputting the calculated distance via the controller.

5. The method of claim 4, further comprising:
   outputting the calculated distance via the controller to at least one of an analog signal, a digital signal, a display screen, an email, a text message, a document, a fax/facsimile machine, and a voice message.

6. A non-transitory computer program product comprising a computer readable storage medium having computer executable instructions stored thereon that, when executed by a processor of a computation device, perform a method comprising:
   obtaining, via an aggregation device, at least one Hall voltage reading from each of a linear array of at least three Hall sensors, wherein each of the linear array of at least three Hall sensors is configured to measure a magnetic field associated with a spherical magnet that produces pure dipole magnetic field coupled to an object under test, and to produce the at least one Hall voltage reading that corresponds to the measured magnetic field associated with the spherical magnet;
   measuring, via the aggregation device, the at least one Hall voltage reading from each of the linear array of at least three Hall sensors in a time-division manner;
   fitting, via the computation device, each of the at least one Hall voltage reading received from the aggregation device as a function of position along a line between the spherical magnet and the linear array of at least three Hall sensors;
   calculating, via the computation device, a slope and an intercept associated with each of the fit Hall voltage readings; and
   computing, via the computation device, a distance between the spherical magnet and the linear array of at least three Hall sensors based on the slope and the intercept.

7. The computer program product of claim 6, wherein the method further comprises:
   storing the at least one Hall voltage reading each of the linear array of at least three Hall sensors in association with indicia indicative of each of the linear array of at least three Hall sensors having been selected in the computation device.

8. The computer program product of claim 6, wherein the method further comprises:
   outputting the calculated distance via the computation device to at least one of an analog signal, a digital signal, a display screen, an email, a text message, a document, a fax/facsimile machine, and a voice message.

9. The computer program product of claim 6, wherein the method further comprises:
   filtering the at least one Hall voltage reading from each of the linear array of at least three Hall sensors to obtain a filtered version of the at least one Hall voltage reading from each of the linear array of at least three Hall sensors,
   wherein the fitting the at least one Hall voltage reading as a function of one or more separations among the linear array of at least three Hall sensors is based on the filtered version of the at least one Hall voltage reading from each of the linear array of at least three Hall sensors.

10. A method of measuring distance without sensor calibrations, comprising:
    coupling a spherical magnet that produces pure dipole magnetic field to an object under test;
    providing a linear array of at least three Hall sensors, each configured to measure the magnetic field associated with the spherical magnet and to produce at least one Hall voltage reading that corresponds to the measured magnetic field associated with the spherical magnet;

obtaining, via an aggregation device, the at least one Hall voltage reading from each of the linear array of at least three Hall sensors in a time-division manner;

fitting, via a computation device, each of the at least one Hall voltage reading obtained from the aggregation device as a function of position along a line between the spherical magnet and the linear array of at least three Hall sensors;

calculating, via the computation device, a slope and an intercept associated with each of the fit Hall voltage readings; and computing, via the computation device, a distance between the spherical magnet and the linear array of at least three Hall sensors based on the slope and the intercept.

* * * * *